United States Patent [19]

Kumai et al.

[11] Patent Number: 5,130,780
[45] Date of Patent: Jul. 14, 1992

[54] DUAL IN-LINE PACKAGING WITH IMPROVED MOISTURE RESISTANCE

[75] Inventors: Toshio Kumai, Tokyo; Takaki Kokubun, Ibaraki; Shingo Nojiri, Tochigi, all of Japan

[73] Assignee: Fujitsu Limited, Kawasaki, Japan

[21] Appl. No.: 672,786

[22] Filed: Mar. 21, 1991

Related U.S. Application Data

[63] Continuation of Ser. No. 474,957, Feb. 5, 1990, abandoned.

[30] Foreign Application Priority Data

Feb. 7, 1989 [JP] Japan ................................. 1-28136

[51] Int. Cl.$^5$ .................... H01L 23/28; H01L 23/16; H01L 23/48
[52] U.S. Cl. ........................................ 357/72; 357/75; 357/68
[58] Field of Search ................... 357/72, 71, 84, 23.1, 357/74, 79, 68, 75, 74, 72

[56] References Cited

U.S. PATENT DOCUMENTS

| | | | |
|---|---|---|---|
| 3,911,475 | 10/1975 | Szedon et al. | 357/72 |
| 4,001,655 | 1/1977 | Voyles et al. | 357/72 |
| 4,717,948 | 1/1988 | Sakai et al. | 357/74 |
| 4,758,875 | 7/1988 | Fujisaki et al. | 357/71 |
| 4,803,543 | 2/1989 | Inayoshi et al. | 357/79 |

Primary Examiner—William D. Larkins
Assistant Examiner—Carl Whitehead, Jr.
Attorney, Agent, or Firm—Armstrong & Kubovcik

[57] ABSTRACT

A dual in-line packaging comprises a substrate having a top surface, a bottom surface and a peripheral surface, semiconductor chips mounted on the top and bottom surfaces of the substrate, a plurality of terminals fixed to the substrate and projecting from the bottom surface of the substrate, a first layer made of a first material and covering the bottom surface of the substrate and the semiconductor chips, and a second layer made of a second material and covering the top surface of the substrate and the semiconductor chips. The first material is resilient and moisture resistant and the second material is hard compared to the first material.

10 Claims, 3 Drawing Sheets

DUAL IN-LINE PACKAGING WITH IMPROVED MOISTURE RESISTANCE

This application is a continuation of application Ser. No. 474,957 filed Feb. 5, 1990, now abandoned.

BACKGROUND OF THE INVENTION

The present invention generally relates to dual in-line packagings and methods of producing the same, and more particularly to a dual in-line packaging with an improved moisture resistance and a method of producing the same.

In order to provide a desired moisture resistance, an integrated circuit packaging has a structure in which top and bottom surfaces of a substrate are covered by a resin. However, there are demands for an integrated circuit packaging with an improved moisture resistance such that the moisture resistance is maintained even when an external force is applied on terminals of the integrated circuit packaging.

FIG.1 shows a conventional dual in-line packaging 1 of an integrated circuit. The packaging 1 comprises a ceramic substrate 2, semiconductor chips 3 and 4 which are respectively mounted on top and bottom surfaces of the substrate 2, and terminals 5 and 6 which are fixed on both sides of the substrate 2. A resin layer 7 is formed on the top portion of the packaging 1 and a resin layer 8 is formed on the bottom portion of the packaging 1. These resin layers 7 and 8 are made of a glass fiber reinforced phenolic resin. The packaging 1 is mounted on a printed circuit board 9 by soldering the terminals 5 and 6 on the printed circuit board 9.

The printed circuit board 9 may warp due to heat or the like. In this case, an external force is applied on the terminals 5 (or 6) due to the warp. For example, the terminal 5 shown in FIG.2A may be pulled and bent as shown in FIG.2B by the external force. But when the terminal 5 is bent, cracks 10 may be formed in the resin layer 8 as shown in FIG.2B because the glass fiber reinforced phenolic resin is a hard material. When the cracks 10 are formed in the resin layer 8, the moisture can easily enter the inside of the packaging 1 and damage the integrated circuits. As a result, the serviceable life of the packaging 1 is shortened by the deterioration of the moisture resistance caused by the cracks 10.

On the other hand, with regard to the top surface of the packaging 1, it is conceivable to thicken the resin layer 7 to reduce the irregularities on the top surface and facilitate a printing on the top surface. However, when the thickness of the resin layer 7 is large, the contraction stress is large when the phenolic resin hardens. As a result, an active layer on the substrate 2 may separate from the substrate and the semiconductor chips 3 may float from the substrate 2.

SUMMARY OF THE INVENTION

Accordingly, it is a general object of the present invention to provide a novel and useful dual in-line packaging and a method of producing the same wherein the problems described above are eliminated.

Another and more specific object of the present invention is to provide a dual in-line packaging comprising a substrate having a top surface, a bottom surface and a peripheral surface, semiconductor chips mounted on the top and bottom surfaces of the substrate, a plurality of terminals fixed to the substrate and projecting from the bottom surface of the substrate, the terminals being arranged in-line along parallel sides of the substrate, a first layer made of a first material and covering the bottom surface of the substrate and the semiconductor chips, and a second layer made of a second material and covering the top surface of the substrate and the semiconductor chips, where the first material is resilient and moisture resistant and the second material is hard compared to the first material. According to the dual in-line packaging of the present invention, it is possible to maintain the moisture resistance even when an external force is applied to the terminals and the terminals are deformed.

Still another object of the present invention is to provide a method of producing a dual in-line packaging comprising the steps of preparing a substrate having semiconductor chips mounted on top and bottom surfaces of the substrate and having plurality of terminals projecting from the bottom surface of the substrate, where the terminals are arranged in-line along parallel sides of the substrate, forming a first layer made of a first material over the bottom surface of the substrate and the semiconductor chips, and forming a second layer made of a second material over the top surface of the substrate and the semiconductor chips, where the first material is resilient and moisture resistant and the second material is hard compared to the first material. According to the method of the present invention, it is possible to improve the moisture resistance especially when a silicone resin is used for the first material and a phenolic resin containing fiber glass is used as the second material.

Other objects and further features of the present invention will be apparent from the following detailed description when read in conjunction with the accompanying drawings.

DESCRIPTION OF THE PREFERRED EMBODIMENTS

Figure 1:
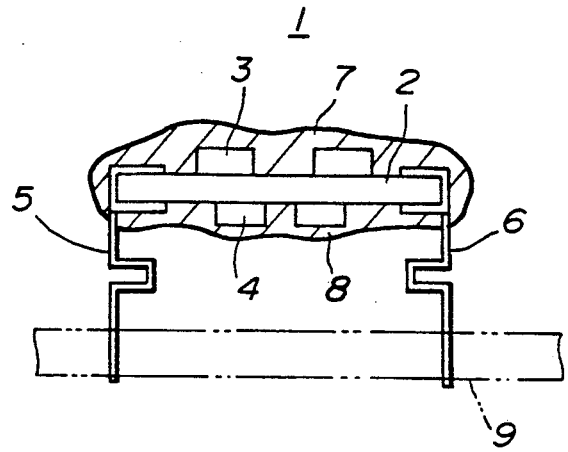
FIG.1 is a cross sectional view showing an example of a conventional integrated circuit packaging.
Figure 2A:
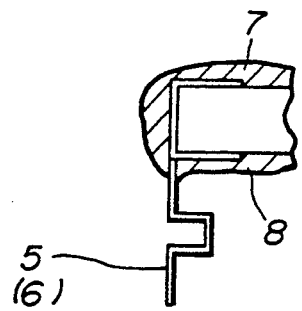
FIGS.2A and 2B respectively are cross sectional views showing a portion of the conventional integrated circuit packaging shown in FIG.1 for explaining the formation of cracks in the packaging.
Figure 2B:
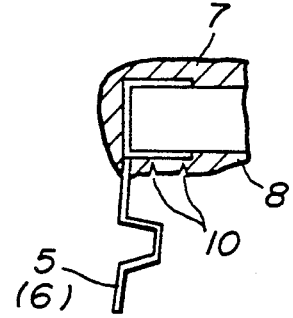
Figure 3:
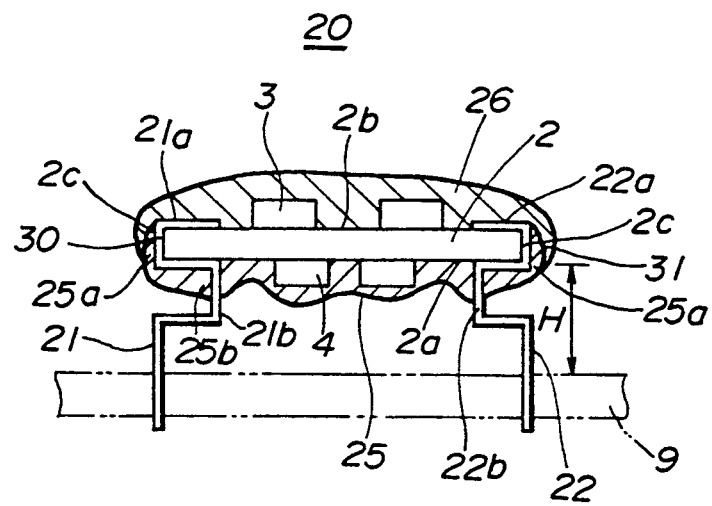
FIG.3 is a cross sectional view showing an embodiment of a dual in-line packaging according to the present invention.

FIG.3 shows an embodiment of a dual in-line packaging according to the present invention. In FIG.3, those parts which are substantially the same as those corresponding parts in FIG.1 are designated by the same reference numerals, and a description thereof will be omitted.

Figure 4:
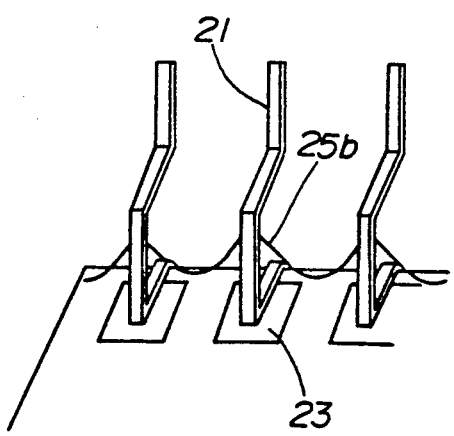
FIG.4 is a perspective view showing a terminal portion of the embodiment.

Terminals 21 and 22 of a dual in-line packaging 20 respectively have approximately U-shaped portions 21a and 22a which engage respective sides of the substrate 2 and approximately L-shaped portions 21b and 22b which connect to the respective U-shaped portions 21a and 22a and absorb the stress. The terminals 21 are shown in FIG.4 on an enlarged scale. The U-shaped portion 21a of each terminal 21 fits over the side of the substrate 2 and is soldered on a land 23. The terminals 22 are soldered in a similar manner.

A silicone resin layer 25 covers a bottom surface 2a and a peripheral surface 2c of the substrate 2. The silicone resin layer 25 has a rubber hardness of 80° or less. A glass fiber reinforced phenolic resin layer 26 which is added with 80 vol % of fiber glass is formed on a top surface 2a of the substrate 2 and a portion 25a of the silicone resin layer 25 which covers the peripheral surface 2c of the substrate 25.

Next, a description will be given of an embodiment of a method of producing the dual in-line packaging according to the present invention, and particularly of the method of forming the resin layers 25 and 26.

Figure 5A:
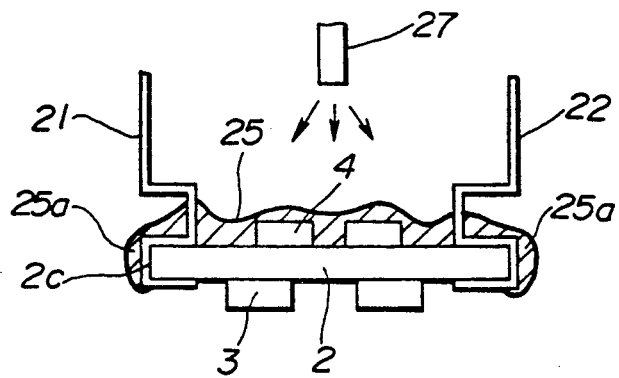
FIGS.5A through 5C respectively are diagrams for explaining an embodiment of a method of producing the dual in-line packaging according to the present invention.

In FIG.5A, the substrate 2 is positioned so that the bottom surface 2a faces up and a dispenser 27 is used to form the silicone resin layer 25. The silicone resin has a fine flow property and the silicone resin positively enters to the rear side of the terminals 21 and 22. Hence, as shown in FIG.4, the silicone resin layer 25 completely covers the U-shaped portion 21a of each terminal 21 and forms a conical portion 25b in the periphery of the L-shaped portion 21b due to the surface tension. The silicone resin layer 25 also covers the peripheral surface 2c of the substrate 2.

Figure 5B:
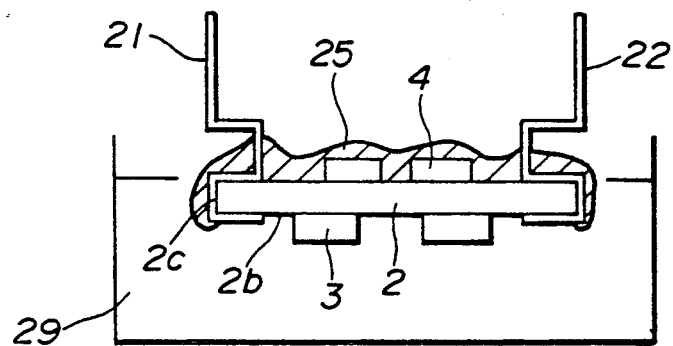

Next, after the silicone resin layer 25 is hardened by a thermal process, the substrate 2 is dipped in a phenolic resin liquid 29 which is added with 80 vol % of fiber glass so that both the top surface 2b and the peripheral surface 2c of the substrate 2 are submerged in the phenolic resin liquid 29 as shown in FIG.5B.

Figure 5C:
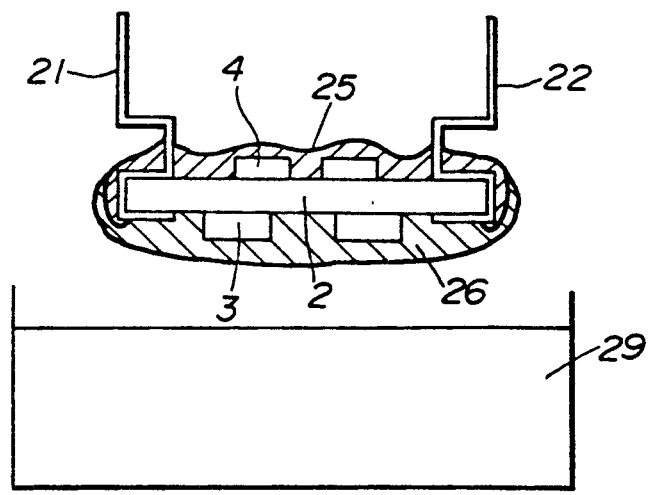

Thereafter, the substrate 2 is pulled out of the phenolic resin layer 29 as shown in FIG.5C. The phenolic resin which covers the substrate 2 hardens by a thermal process to form the phenolic resin layer 26.

Hence, the silicone resin layer 25 covers the surfaces 2b and 2c of the substrate 2, and the phenolic resin layer 26 covers the surface 2a of the substrate 2 and a portion of the silicone resin layer 25.

Next, a description will be given of the moisture resistance characteristic of the dual in-line packaging 20 which is provided with the resin layers 25 and 26.

The silicone resin layer 25 and the phenolic resin layer 26 themselves respectively have a high moisture resistance because both silicone resin and phenolic resin are moisture resistant materials.

Generally, the silicone resin has a poor adhesion with respect to other resins. For this reason, a resin layer which is formed on a silicone resin layer easily separates. But in the dip coating process described above in conjunction with FIG.5B, the phenolic resin liquid which is used is added with a large quantity of fiber glass and has a quick-dry characteristic. For this reason, the adherence of the phenolic resin layer 26 and the portion 25a of the silicone resin layer 25 is satisfactory, and the phenolic resin layer 26 does not easily separate from the silicone resin layer 25. Therefore, the moisture is positively prevented from entering the inside of the dual in-line packaging 20 via junction interfaces 30 and 31 between the silicone resin layer 25 and the phenolic resin layer 26.

Figure 6A:
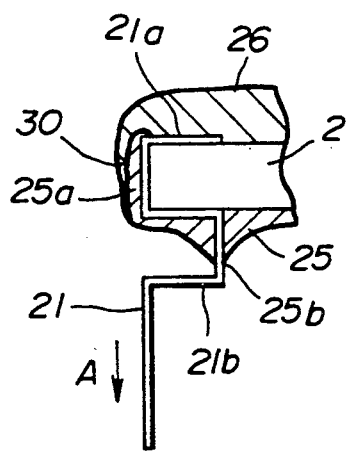
FIGS.6A and 6B respectively are diagrams for explaining the embodiment when an external force is applied on terminals of the packaging.
Figure 6B:
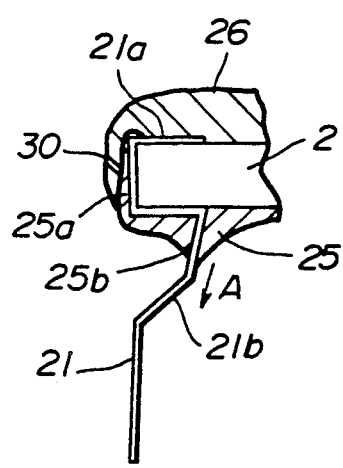

FIGS.6A and 6B respectively are diagrams for explaining the embodiment when an external force is applied on the terminals 21 of the dual in-line packaging 20. When an external force is applied on the terminal 21 in a direction A shown in FIG.6A due to a warping of the printed circuit board 9 or the like, the L-shaped portion 21b of the terminal 21 is bent and stretched as shown in FIG.6B to absorb the stress. The external force which deforms the terminal 21 is also applied on the silicone resin layer 25. However, the rubber hardness of the silicone resin layer 25 is 80° or less, and the silicon resin layer 25 undergoes a resilient deformation depending on the deformation of the terminal 21. As a result, no cracks are formed in the silicone resin layer 25 even when the terminal 21 is deformed by the external force. The silicone resin layer 25 returns to its original state when the terminal 21 returns to its original state free of the stress.

The terminal 22 and the silicone resin layer 25 undergo similar deformations when the external force is applied on the terminal 22. Hence, no cracks are formed in the silicone resin layer 25.

Accordingly, even when an external force is applied on the terminals 21 and/or the terminals 22, the moisture resistance of the dual in-line packaging is maintained to the initial moisture resistance.

Next, a description will be given of the characteristics of the phenolic resin layer 26 other than its moisture resistance characteristic. The phenolic resin used in this embodiment is added with a large quantity of fiber glass. For this reason, the contraction of the phenolic resin during the thermal hardening is considerably small compared to the case where no glass fiber is added to the phenolic resin. Hence, the active layer on the top surface 2b of the substrate 2 will not separate from the substrate 2 and the semiconductor chips 3 will not float from the substrate 2 when the thermal hardening of the phenolic resin layer 26 takes place.

On the other hand, because the glass fiber reinforced phenolic resin layer 26 is added with the large quantity of fiber glass, the coefficient of thermal expansion of the glass fiber reinforced phenolic resin layer 26 is considerably small compared to the case where no fiber glass is added to the phenolic resin. Therefore, the coefficient of thermal expansion of the phenolic resin layer 26 is similar to the coefficient of thermal expansion of the ceramic substrate 2. Accordingly, a thermal stress not easily generated during the operation of the dual in-line packaging 20, and it is possible to prevent the substrate 2 from cracking and prevent cracks from being formed in the phenolic resin layer 26.

The phenolic resin layer 26 of this embodiment enables an ink printing to be made thereon because the phenolic resin layer 26 contains fiber glass. Further, the hardness of the phenolic resin layer 26 enables the phenolic resin layer 26 to sufficiently function as a protection layer.

Next, a description will be given of the characteristics of the terminals 21 and 22. The terminals 21 and 22 respectively have a stress absorbing portion immediately below a connecting portion where the terminals 21 and 22 connect to the substrate 2. Thus, compared to the case where the stress absorbing part is provided at an intermediate part of the terminal as in the case of the terminal 5 shown in FIG.1, it is possible to mount the dual in-line packaging 20 on the printed circuit board 9 with a height which is lower than that of the conventional packaging.

In the described embodiment, the layer 25 is made of the silicone resin and the layer 26 is made of the phenolic resin containing fiber glass. However, it is possible to use other materials for the layers 25 and 26 as long as the layer 25 is made of a resilient material which has a satisfactory moisture resistance and the layer 26 is made of a relatively hard material which also has a satisfactory moisture resistance. For example, the material used for the layer 25 may be selected from a group which includes polyurethane, polyurethane rubber, silicon rubber and flexible epoxy. On the other hand, the material used for the layer 26 may be selected from a group which includes melamine resin and epoxy resin containing fiber glass.

Moreover, the material used for the substrate 2 is not limited to ceramics. For example, the substrate 2 may be made of an epoxy glass.

In addition, the shape of the terminals 21 and 22 is not limited to those of the described embodiment. For example, the stress absorbing portion of the terminal may be located at an intermediate part of the terminal as in the case of the conventional packaging shown in FIG.1.

Further, the present invention is not limited to these embodiments, but various variations and modifications may be made without departing from the scope of the present invention.

What is claimed is:

1. A dual in-line packaging comprising:
   a substrate having a top surface, a bottom surface and a peripheral surface;
   semiconductor chips mounted on the top and bottom surfaces of said substrate;
   a plurality of terminals fixed to said substrate and projecting from the bottom surface of said substrate;
   a first layer made of a first material and covering the bottom surface of said substrate and bottom surface mounted semiconductor chips, wherein a portion of said first layer is in direct contact with the bottom surface of the substrate, and wherein said first layer has side portions having inner surfaces in direct contact with said substrate peripheral surface; and
   a second layer made of a second material and covering the top surface of said substrate and top surface mounted semiconductor chips, wherein a portion of said second layer is in direct contact with the top surface of the substrate, and wherein said second layer has side portions having inner surfaces in direct contact with outer surfaces of said first layer side portions,
   said first material being resilient and moisture resistant, said second material being hard compared to said first material, said terminals being arranged in-line along parallel sides of said substrate and penetrating through said first layer to thereby maintain the moisture resistance of said duel in-line packaging even when an external force is applied to said terminals.

2. The dual in-line packaging as claimed in claim 1 wherein said terminals respectively have a stress absorbing portion for absorbing a stress which is generated when the terminals are deformed by an external force.

3. The dual in-line packaging as claimed in claim 2 wherein said terminals respectively have an approximately U-shaped portion which sandwiches a side portion of said substrate, and said stress absorbing portion has an approximately L-shape which connects to said U-shaped portion.

4. The dual in-line packaging as claimed in claim 1 wherein said first material is a silicone resin, and said second material is a phenolic resin which contains glass fiber.

5. The dual in-line packaging as claimed in claim 1 wherein said first material is selected from a group which includes polyurethane, polyurethane rubber, silicon rubber and flexible epoxy.

6. The dual in-line packaging as claimed in claim 1 wherein said second material is selected from a group which includes melamine resin and epoxy resin containing fiber glass.

7. The dual in-line packaging as claimed in claim 1 wherein said substrate is made of a material selected from a group which includes ceramics and glass epoxy.

8. The dual in-line packaging as claimed in claim 1 wherein said first layer further covers the peripheral surface of said substrate, and said second layer further covers a portion of said first layer covering the peripheral surface of said substrate.

9. A dual in-line packaging, comprising:
   a substrate having a top surface, a bottom surface and a peripheral surface;
   semiconductor chips mounted on the top and bottom surfaces of said substrate;
   a plurality of terminals fixed to said substrate and projecting from the bottom surface of said substrate;
   a first layer made of a first material and covering the bottom surface of said substrate and bottom surface mounted semiconductor chips, wherein said first layer includes side portions having inner surfaces in direct contact with said peripheral surface of said substrate, wherein a portion of said first layer is in direct contact with the bottom surface of the substrate; and
   a second layer made of a second material and covering the top surface of said substrate and top surface mounted semiconductor chips, wherein said second layer includes side portions having inner surfaces in direct contact with outer surfaces of said first layer side portions, wherein a portion of said second layer is in direct contact with the top surface of the substrate,
   said first material being resilient and moisture resistant, said second material being hard compared to said first material, said terminals being arranged in-line along parallel sides of said substrate and penetrating through said first layer to thereby maintain the moisture resistance of said dual in-line packaging even when an external force is applied to said terminals.

10. A dual in-line packaging, comprising:
   a substrate having a top surface, a bottom surface and a peripheral surface;
   semiconductor chips mounted on the top and bottom surfaces of said substrate;
   a plurality of terminals fixed to said substrate and projecting from the bottom surface of said substrate;
   a first layer made of a first material and covering the bottom surface of said substrate and bottom surface mounted semiconductor chips, wherein said first layer includes side portions having inner surfaces in direct contact with said peripheral surface of said substrate, wherein a portion of said first layer is in direct contact with the bottom surface of the substrate; and a second layer made of a second material and covering the top surface of said substrate and top surface mounted semiconductor chips, wherein said second layer includes side portions having inner surfaces in direct contact with outer surfaces of said first layer side portions, wherein a portion of said second layer is in direct contact with the top surface of the substrate, said first material being resilient and moisture resistant, said second material being hard compared to said first material, said second layer having a substantial quantity of fiber glass so as: (a) to provide an adherence between said side portions of said first and second layers to prevent moisture from entering therebetween, and (b) to have the coefficient of thermal expansion of said second layer be similar to that of said substrate to thereby prevent the generation of thermal stress and cracks in said second layer, said terminals being arranged in-line along parallel sides of said substrate and penetrating through said first layer to thereby maintain the moisture resistance of said dual in-line packaging even when an external force is applied to said terminals.

* * * * *